United States Patent
Butters

(10) Patent No.: US 9,510,092 B2
(45) Date of Patent: Nov. 29, 2016

(54) METHOD AND APPARATUS FOR PROCESSING A SWITCHED AUDIO SIGNAL FROM A CROSSPOINT ROUTER

(71) Applicant: Snell Limited, Reading, Berkshire (GB)

(72) Inventor: Jeff Butters, Reading (GB)

(73) Assignee: Snell Limited, Reading, Berkshire (GB)

( * ) Notice: Subject to any disclaimer, the term of this patent is extended or adjusted under 35 U.S.C. 154(b) by 77 days.

(21) Appl. No.: 14/539,840

(22) Filed: Nov. 12, 2014

(65) Prior Publication Data

US 2015/0131815 A1    May 14, 2015

(30) Foreign Application Priority Data

Nov. 14, 2013  (GB) .................................. 1320124.9

(51) Int. Cl.
| | | |
|---|---|---|
| H04R 3/00 | (2006.01) | |
| H03G 3/34 | (2006.01) | |
| G11B 27/028 | (2006.01) | |
| H04H 60/04 | (2008.01) | |

(52) U.S. Cl.
CPC .............. *H04R 3/00* (2013.01); *G11B 27/028* (2013.01); *H03G 3/34* (2013.01); *H03G 3/348* (2013.01); *H04H 60/04* (2013.01); *H04R 2420/01* (2013.01)

(58) Field of Classification Search
CPC ........ H03G 3/348; H03G 3/34; H03F 1/305; H03F 2200/03
USPC ......................................... 381/123, 94.5, 119
See application file for complete search history.

(56) References Cited

U.S. PATENT DOCUMENTS

| | | | |
|---|---|---|---|
| 6,993,127 B2* | 1/2006 | Bailey ................... | H04M 3/304 324/126 |
| 8,098,840 B2* | 1/2012 | Ku ........................... | H04S 1/002 330/88 |
| 8,160,272 B1 | 4/2012 | Blackburn et al. | |
| 8,160,277 B2* | 4/2012 | Noethlings ............. | H04S 1/007 381/1 |
| 8,625,818 B2* | 1/2014 | Stultz ................... | H03K 17/005 381/123 |
| 9,054,692 B2* | 6/2015 | Rodriguez .......... | H03K 17/005 |
| 9,154,872 B2* | 10/2015 | Muench ................... | H04R 3/00 |
| 2002/0167608 A1 | 11/2002 | Szybiak et al. | |
| 2008/0240464 A1* | 10/2008 | Noethlings ............. | H04S 1/007 381/94.5 |
| 2013/0282917 A1 | 10/2013 | Reznik et al. | |

FOREIGN PATENT DOCUMENTS

GB      2117555 A      10/1983

OTHER PUBLICATIONS

United Kingdom Patent Application No. GB 1320124.9 Search Report, dated Apr. 7, 2014 (1 page).

* cited by examiner

*Primary Examiner* — Disler Paul
(74) *Attorney, Agent, or Firm* — Michael Best & Friedrich LLP

(57) ABSTRACT

Apparatus is provided for processing a switched audio signal output received from a crosspoint router having a plurality of inputs and a plurality of outputs, there being a control signal that defines which of the plurality of inputs is to be routed by the crosspoint router to which of the plurality of outputs. A control unit receives the control signal and serves to identify a route change in the control signal. An instantaneous value of the switched audio signal prior to the route change is stored. A signal processing unit then combines the stored value with values of the switched audio signal after the route change to form a processed audio signal that changes smoothly.

17 Claims, 3 Drawing Sheets

METHOD AND APPARATUS FOR PROCESSING A SWITCHED AUDIO SIGNAL FROM A CROSSPOINT ROUTER

FIELD OF INVENTION

This invention relates to the switching of audio signals.

BACKGROUND OF THE INVENTION

Processes and systems for the production and distribution of audio material, and the audio component of audiovisual material, frequently need to change the audio source that is to be supplied to a particular audio destination. Such changes to the 'routing' of audio signals may take place in 'audio mixers' or 'switching matrices'. These devices may handle only audio signals, separate audio and video signals, or combined audio and video signals.

Mixers usually provide means for crossfading between different audio signals, whereas switching matrices (also known as audio routers) usually change almost instantaneously between different audio sources. A typical audio switching matrix may include some audio processing functions, for example adjustment of audio gain or delay, or the separation or combination of audio and video signals. However, control of the transitions between different audio sources is not usually provided. In this case, a virtually instantaneous change in the value of an output audio signal at a destination will occur when switching between different audio sources.

Such changes can be subjectively disturbing to a listener as, depending on the content of the switched audio, they may represent unnatural 'pops' or 'clicks'. In some cases, it is necessary to process the audio signal in real-time, thus limiting the available options for processing and/or potentially requiring very large processing resources. In addition, audio switching matrices often have very large numbers of input sources and output destinations, which again may imply a need for very large processing resources. It would however clearly be preferred if the switching process could be implemented with only minimal processing resources. There is thus a need for a simple and easily-implemented method and apparatus for improving the subjective effect of changes to the routing of audio signals.

SUMMARY OF THE INVENTION

Therefore, according to a first aspect of the present invention there is provided a method of processing a switched audio signal, comprising the steps of: receiving said switched audio signal; receiving a control signal, which carries control data that defines which of a plurality of inputs is to be routed to which of a plurality of outputs by a crosspoint router; identifying, in said control signal, a route change; and forming a processed audio signal that, by using said identified route change, changes smoothly from the switched audio signal before said route change to the switched audio signal after said route change, thus making any abrupt transition in said switched audio signal less subjectively annoying to a listener.

According to a second aspect of the present invention there is provided apparatus for processing a switched audio signal, the signal processing apparatus being adapted to: receive said switched audio signal and a control signal, the control signal carrying control data that defines which of a plurality of inputs is to be routed to which of a plurality of outputs by a crosspoint router; identify, in said control signal, a route change; and form a processed audio signal that, by using said identified route change, changes smoothly from the switched audio signal before said route change to the switched audio signal after said route change, thus making any abrupt transition in said switched audio signal less subjectively annoying to a listener.

The aforementioned method and apparatus may work in real-time. More particularly, the processed audio signal may be formed in real-time.

By using a control signal that may be sent to the router to cause the route change, it is possible to anticipate a change in the audio source of said switched audio signal, which carries the risk of an abrupt transition in the switched audio signal. Hence, or otherwise, it is possible to form a processed audio signal that changes smoothly from the switched audio signal before the route change to the switched audio signal after the route change. Suitably, the change may be from the instantaneous value of the switched audio signal prior to said route change, and may be the instantaneous value when said route change is identified, to the value of the switched audio signal after the route change, typically of the order of a millisecond after said route change.

The control signal may be the same as that sent to the router which provides said switched audio signal. The aforementioned apparatus may thus include said router. The router may, in response to said control signal route, route one of plurality of inputs, selected in accordance with said control data, to one of said plurality of outputs, also selected in accordance with said control data. In response to said route change, said selected one of said inputs and/or said selected one of said outputs may change. The apparatus may include a signal processing unit adapted to receive said switched audio signal and said control signal; identify, in said control signal, said route change; and form said processed audio signal. Said signal processing unit may receive said control signal substantially simultaneously with said router; this may aid in forming the processed audio signal in real-time.

Suitably, said processed audio signal may, by using said identified route change, be formed such that the smooth change begins prior to the time when any abrupt transition in said switched audio signal as a result of said route change might occur. In embodiments, the instantaneous value of said switched audio signal may, by identifying said route change, be stored prior to the time when any such abrupt transition in said switched audio signal as a result of said route change might occur.

The present invention also provides a computer program product adapted to cause programmable apparatus to implement any aforementioned method or any method described herein. Specifically, it may provide a non-transient computer program product adapted to cause programmable apparatus to implement any aforementioned method or any method described herein.

The following disclosure describes a method and apparatus for processing a switched audio signal that includes an abrupt transition between a first audio signal received from a first audio source and a second audio signal received from a second audio source so as to make the abrupt transition less subjectively annoying to a listener, wherein an instantaneous value of the said switched audio signal prior to the said abrupt transition is stored and a processed audio signal is formed by combining the said switched audio signal with the said stored instantaneous value.

Suitably, the processed audio signal comprises a crossfade between the said stored value and the said switched audio signal.

In a preferred embodiment a proportion of the difference between the current value of the said switched audio signal and the said stored instantaneous value is subtracted from the said current value.

DETAILED DESCRIPTION OF THE INVENTION

Figure 1:
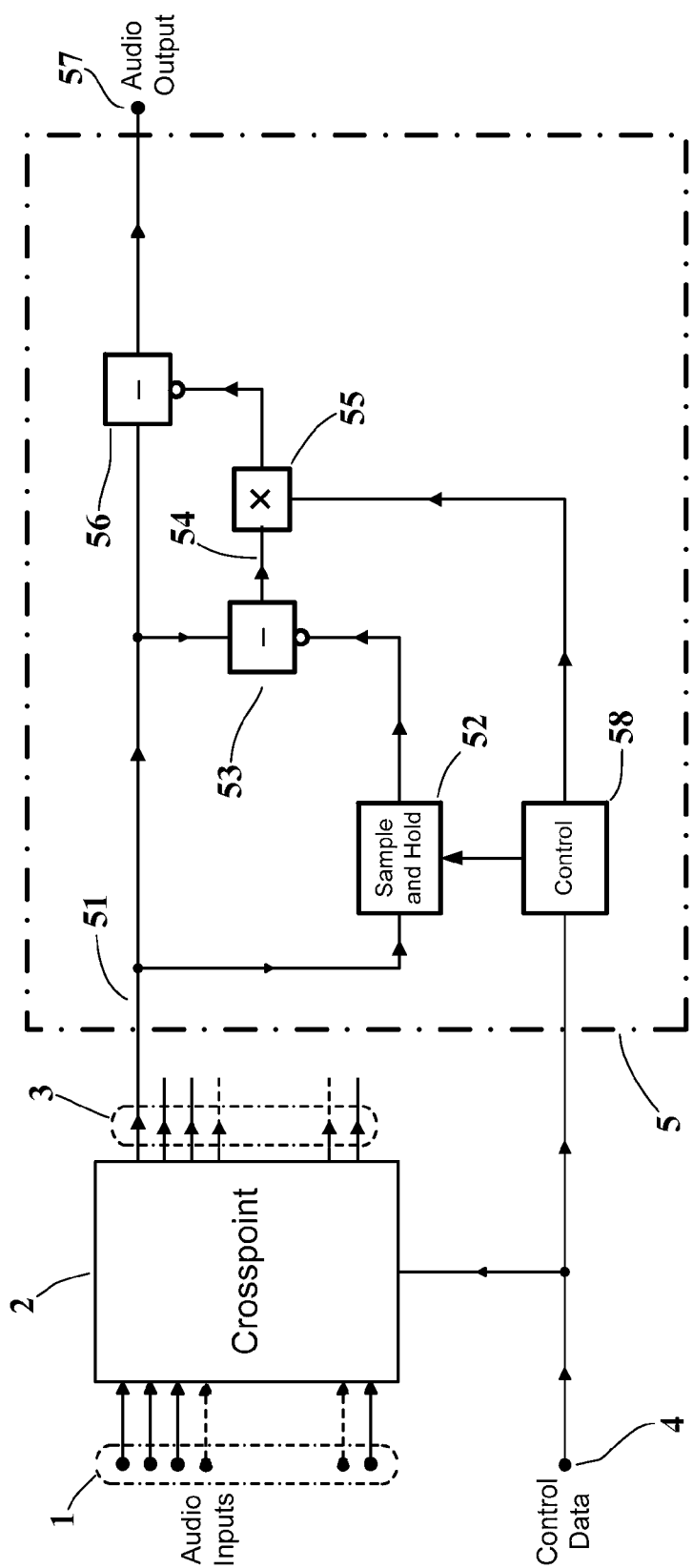
FIG. 1 shows an audio switching system according to an embodiment of the invention.

An example of an audio switching system according to the invention is shown in FIG. 1. A set of audio inputs (1) is input to a 'crosspoint' (2), which can route any of the audio inputs (1) to any of a set of audio outputs (3). The crosspoint (2) operates in a known manner under the control of control data (4), which defines which of the inputs (1) is to be routed to which of the outputs (3).

Figure 2:
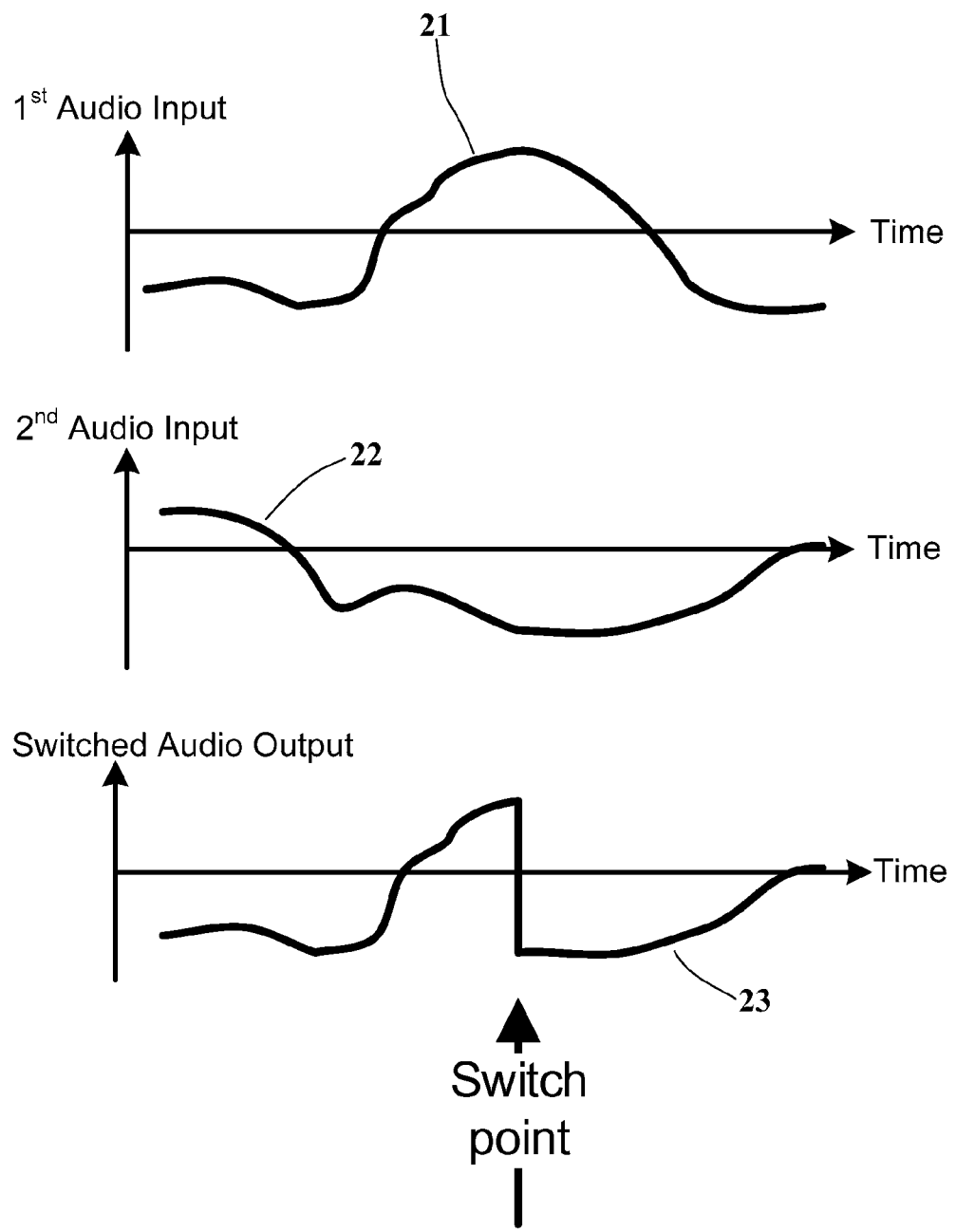
FIG. 2 shows two audio signals and the result of switching between them.

When the control data changes the routing to a particular output (3), the current value of the new audio signal replaces the current value of the old audio signal virtually instantaneously. Typically, the audio signals will comprise digital samples and, at the time of a route change, a sample from one audio input will be immediately followed by a sample from another input. The value of these consecutive output samples will be unrelated and a step change in the output audio signal will very likely result; for example as shown in FIG. 2, which shows, at (23), the output audio signal resulting from switching between a first audio input signal (21) and a second audio input signal (22).

According to an embodiment of the invention, each of the outputs (3) is processed to avoid step changes as shown at (5). The crosspoint output (51) is routed to a sample and hold function (52). When the routing within the crosspoint (2) is changed, the sample and hold function (52) holds the value of the audio signal immediately prior to the route change, and outputs a constant level signal. This output is subtracted from the crosspoint output (51) in a subtractor (53). The output (54) from the subtractor (53) is applied to a multiplier (55), whose output is subtracted from the crosspoint output (51) in a second subtractor (56), to form an audio output (57).

As the skilled person will appreciate, the arrangement of the subtractors (53) and (56) with the multiplier (55) causes the audio output (57) to comprise a mix of the crosspoint output (51) and the output from the sample and hold function (52). When the multiplier (55) multiplies by unity, the audio output (57) is equal to the output from the sample and hold function (52); and, when the multiplier (55) multiplies by zero, audio output (57) is equal to crosspoint output (51). When the multiplier multiplies by a value between zero and unity, the output (57) comprises a mix of the output from the sample and hold function (52), and the crosspoint output (51); and the relative proportions of these two constituent parts of the output (57) depend on the multiplication factor.

The multiplier (55) is controlled by a control system (58) that causes it to multiply by zero, except during a short period starting immediately before a route change that affects the crosspoint output (51). Immediately before the route change occurs, the multiplication factor is changed to unity, so that the held value from the sample and hold function (52) is output to the output terminal (57). The multiplication factor is then smoothly returned to zero over a short time, typically one or two milliseconds.

Figure 3:
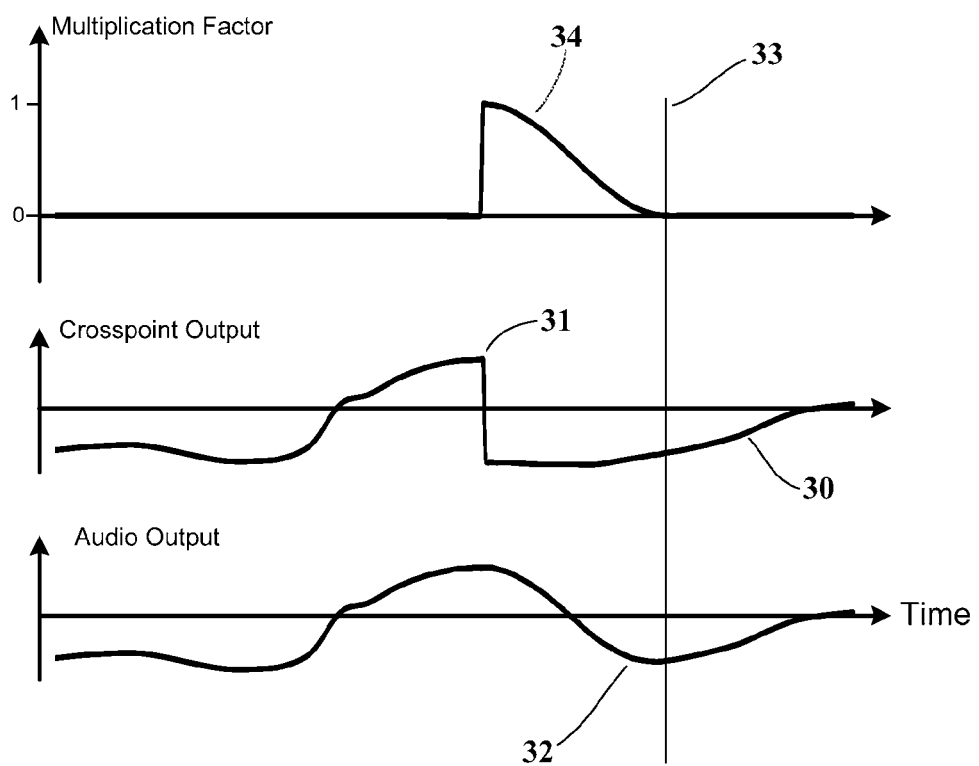
FIG. 3 shows two audio signals and a control signal according to an embodiment of the invention.

The result of applying this process is shown in FIG. 3. An audio signal (30) from a crosspoint output has a step change at a switch point (31). The output audio signal (32) from the process (5) changes smoothly between the value of the signal (30) prior to the switch point, and the value at a later time (33). In this way the audibility of the transient at the switch point (31) is reduced.

The variation of the multiplication factor is shown at (34). The multiplication factor is zero until immediately prior to the switch point (31) where it changes to unity, thereafter it falls smoothly to zero. The figure shows a transition having the well-known 'raised cosine' shape, but a linear transition having a constant rate of change can also be used.

Some audio routing systems handle audio signals which are coded, so that some of the signals which are routed do not directly represent the value of an audio signal. These coded signals should not be processed by combination with previous, held values. The control system (55) can include a test that the crosspoint output signal (51) is an uncoded audio signal, and hold the multiplication value at zero when coded audio is input to the process (5). The type of audio data can be indicated within the control data (4), or detected by analysis of the crosspoint output signal (51).

There are a number of alternative ways of implementing the invention. As mentioned previously the 'shape' of the crossfade between the held audio and the new audio can be a 'ramp' with a constant rate of change, or a 'profiled' change in which the rate of change is reduced at the start and end of the transition. It is also helpful to avoid combination of the audio signal with a held value when the signals involved in the route change are similar or identical, and therefore the transition would be imperceptible to a listener.

The signal path via the subtractor (53) and the multiplier (55) need not preserve the full quality of the audio signal, as it only contributes to the output for a short period of time. It could have lower bandwidth, or be quantised with fewer bits, than the main audio path from the crosspoint output (51) to the audio output (57).

The invention may be embodied for example in dedicated hardware; in programmable hardware; or in computer software. The invention is applicable to both analogue and digital audio signals. The processes of sample and hold, subtraction and multiplication of analogue and digital signals and ways of implementing such processes in dedicated hardware; in programmable hardware; or in computer software are well known to the skilled man.

The invention claimed is:

1. A method of processing a switched audio signal in an audio processor, the method comprising:
   receiving said switched audio signal;
   receiving a control signal, which carries control data that defines which of a plurality of inputs is to be routed to which of a plurality of outputs by a crosspoint router;
   identifying, in said control signal, a route change; and
   forming a processed audio signal that, by using said identified route change, changes smoothly from the switched audio signal before said route change to the switched audio signal after said route change;
   further comprising storing an instantaneous value of said switched audio signal prior to said route change:
   wherein forming a processed audio signal includes combining said switched audio signal with said stored instantaneous value.

2. The method according to claim 1, wherein the processed audio signal comprises a crossfade between the said stored value and the said switched audio signal.

3. The method according to claim 2, further comprising subtracting a proportion of the difference between the current value of the said switched audio signal and the said stored instantaneous value from said current value.

4. The method according to claim 3, wherein the value to be subtracted is a digital signal represented at a lower bit rate than the said switched audio signal.

5. The method according to claim 4, further comprising increasing the proportion of the said switched audio signal in the crossfade at a constant rate until it reaches 100%.

6. The method according to claim 2, further comprising increasing the proportion of the said switched audio signal in the crossfade, wherein the rate of increase varies over time during the crossfade.

7. The method according to claim 1, wherein at least said forming step occurs in real-time.

8. An apparatus for processing a switched audio signal output received from a crosspoint router having a plurality of inputs and a plurality of outputs, there being a control signal that defines which of the plurality of inputs is to be routed by the crosspoint router to which of the plurality of outputs, the apparatus comprising:
   a control unit receiving said control signal and serving to identify in said control signal a route change;
   a store adapted to store an instantaneous value of said switched audio signal prior to said route change; and
   a signal processing unit adapted under the control of said control unit to combine said stored value of the switched audio signal prior to said route change with one or more values of the switched audio signal after the route change to form a processed audio signal that changes smoothly from the switched audio signal before said route change to the switched audio signal after said route change.

9. The apparatus according to claim 8, wherein said signal processing unit is adapted such that the processed audio signal comprises a crossfade between the said stored value and the said switched audio signal.

10. The apparatus according to claim 9, wherein the proportion of the said switched audio signal in the crossfade increases at a constant rate until it reaches 100%.

11. The apparatus according to claim 9, wherein the rate of increase of the proportion of the said switched audio signal in the crossfade varies during the crossfade.

12. The apparatus according to claim 8, wherein a proportion of the difference between the current value of the said switched audio signal and the said stored instantaneous value is subtracted from the said current value.

13. The apparatus according to claim 8, wherein said signal processing unit comprises:
   a first subtractor circuit that outputs the difference between the current value of the said switched audio signal and the said stored instantaneous value;
   an multiplier that receives the output signal from said first subtractor circuit and outputs a proportion of the output signal from said first subtractor circuit;
   a second subtractor circuit that subtracts the output of said multiplier from said current value.

14. The apparatus according to claim 12, wherein the value to be subtracted is a digital signal represented at a lower bit rate than the said switched audio signal.

15. The apparatus according to claim 8, adapted to form said processed audio signal in real-time.

16. The apparatus according to claim 8 connected with a crosspoint router having a plurality of inputs and a plurality of outputs, the crosspoint receiving said control signal to define which of the plurality of inputs is to be routed by the crosspoint router to which of the plurality of outputs.

17. A non-transient computer program product adapted to cause programmable apparatus to implement a method comprising the steps of receiving a switched audio signal from a crosspoint router having a plurality of inputs and a plurality of outputs, there being a control signal that defines which of the plurality of inputs is to be routed by the crosspoint router to which of the plurality of outputs;
   receiving said control signal, which carries control data that defines which of a plurality of inputs is to be routed to which of a plurality of outputs by a crosspoint router;
   identifying, in said control signal, a route change; and
   forming a processed audio signal that, by using said identified route change, changes smoothly from the switched audio signal before said route change to the switched audio signal after said route change;
   wherein said processed audio signal is formed by combining a stored value of the switched audio signal prior to said route change with values of the switched audio signal after the route change.

* * * * *